United States Patent [19]
Gallas

[11] Patent Number: 5,815,372
[45] Date of Patent: Sep. 29, 1998

[54] PACKAGING MULTIPLE DIES ON A BALL GRID ARRAY SUBSTRATE

[75] Inventor: William N. Gallas, Queen Creek, Ariz.

[73] Assignee: Intel Corporation, Santa Clara, Calif.

[21] Appl. No.: 822,743

[22] Filed: Mar. 25, 1997

[51] Int. Cl.⁶ .................................................. H01L 25/00
[52] U.S. Cl. .................. 361/760; 361/760; 361/762; 361/764; 361/765; 361/715; 361/787; 361/761; 361/803; 257/778; 257/779; 257/780; 257/782; 257/781; 257/783; 257/784; 257/786; 257/787; 257/773; 257/774; 257/777; 257/686
[58] Field of Search .................................. 361/760, 762, 361/764, 765, 715, 787, 761, 803; 257/778, 779, 780, 782, 781, 783, 784, 786, 787, 773, 774, 777, 686

[56] References Cited

U.S. PATENT DOCUMENTS

| | | | |
|---|---|---|---|
| 5,355,283 | 10/1994 | Marrs et al. | 361/760 |
| 5,477,082 | 12/1995 | Buckley, III et al. | 257/679 |
| 5,502,289 | 3/1996 | Takiar et al. | 174/266 |
| 5,608,262 | 3/1997 | Degani et al. | 257/723 |
| 5,612,513 | 3/1997 | Tuttle et al. | 174/260 |
| 5,646,828 | 7/1997 | Degani et al. | 361/715 |

FOREIGN PATENT DOCUMENTS

| | | | |
|---|---|---|---|
| 3-255657 A | 11/1991 | Japan | 257/777 |
| 5-47998 A | 2/1993 | Japan | 257/778 |

Primary Examiner—Leo P. Picard
Assistant Examiner—David Foster
Attorney, Agent, or Firm—Blakely, Sokoloff, Taylor & Zafman

[57] ABSTRACT

An electrical arrangement including a circuitized substrate, the circuitized substrate having (i) a first substrate surface including a set of substrate contacts disposed thereon, and (ii) a second substrate surface including a set of input/output contacts disposed thereon. The electrical arrangement also includes a first die having (i) a first die surface including a set of first die contacts disposed thereon which is coupled to a first portion of the set of substrate contacts, and (ii) a second die surface configured to receive a second die. In the electrical arrangement, the set of substrate contacts includes a second portion of substrate contacts configured to be coupled to a set of second die contacts disposed on the second die and the circuitized substrate electrically interconnects the first portion and second portion of the set of substrate contacts and the set of input/output contacts to form a predetermined circuit.

11 Claims, 8 Drawing Sheets

PACKAGING MULTIPLE DIES ON A BALL GRID ARRAY SUBSTRATE

BACKGROUND OF THE INVENTION

1. Field of the Invention

The present invention relates to the field of use of integrated circuit design and construction. More particularly, the present invention relates to an integrated circuit package integrating multiple dies on a ball grid array substrate.

2. Description of Related Art

Presently, custom integrated microprocessors are manufactured by starting out with a core microprocessor circuit and such peripheral circuits as memory management units, input/output controllers, peripheral component interconnect/interface (PCI) controllers, industry standard architecture (ISA) bus controllers, and universal asynchronous receiver/transmitter (UART) units. Thus, a device so described would be constructed out of at least two circuits, that is, the core processor circuit and one or more application specific circuits.

Typically, each custom integrated circuit is composed of two or more dies in one package in a side-by-side configuration. Thus, in designing and manufacturing custom microprocessors or microcontrollers, care must be taken to accomodate the possibility of timing mismatches due to normal operating temperature variations between the different integrated circuits. This mismatch occurs as the gain of a transistor (Gm) is directly proportional to the temperature of the transistor. Thus, as the temperature of a transistor increases, the gain of the transistor also increases. The converse also holds true.

Further, the prior art solution uses more board space as each device needs a certain amount of area for pins and contacts. Moreover, having separate devices can create timing problems at higher clock speeds from the longer trace lengths of the bond wires used to connect the devices.

FIG. 1 illustrates a prior art ball grid array (BGA) package 12 where a die 14 is mounted on a substrate 16. Die 14 is mounted contact-side down on a top surface of substrate 16 using such processes as flip chip technology, which is also known as control collapse chip connection (C4) technology. In C4 technology, die 14 is physically attached to substrate 16 when electrical connections are made between: (1) a set of input/output contact pads located on the contact-side of die 14 (not shown); and, (2) a set of substrate contact pads located on top of substrate 16 (not shown). The connections are made through the use of a set of solder balls located between the set of input/output contact pads of die 14 and the set of contact pads on top of substrate 16 which melts under heat to adhere to the contact pads.

The set of contact pads on top of substrate 16 is placed in contact with a set of input/output solder balls 20 through the use of a set of traces 19 contained in substrate 16. Thus, substrate 16 is configured as a miniature circuit board which allows each contact pad in the set of substrate contact pads to be connected in any portion of set of solder balls 20 or even not at all.

After die 14 has been mounted to substrate 16, die 14 is encapsulated in encapsulant 18 to protect die 14 and further secure it to substrate 16. Encapsulant 18 also provides thermal conductivity between die 14 and any heat dissipation devices (e.g., heat sinks, thermal pipes) which are to be attached to package 12.

Given the numerous problems encountered in design, ever faster time-to-market requirements for integrated microprocessors are exceeding the capacity of design teams to successfully integrate peripheral circuits and components with microprocessor cores. The lead time for designing and fabricating integrated microprocessors which do not suffer from timing and other problems described above is becoming ever shorter. Coupled with the relatively small number of device builds for these specialized integrated microprocessors, many times economies of scale are lost.

SUMMARY OF THE INVENTION

The invention described herein is an electrical arrangement including a circuitized substrate, and a first die mounted to that circuitized substrate, with the first die being configured to allow the attachment of a second die through the use of an adhesive material.

In one embodiment, the circuitized substrate has (i) a first substrate surface including a set of substrate contacts disposed thereon, and (ii) a second substrate surface including a set of input/output contacts disposed thereon.

The first die has (i) a first die surface including a set of first die contacts disposed thereon which is coupled to a first portion of the set of substrate contacts, and (ii) a second die surface configured to receive a second die.

In addition, the set of substrate contacts of the circuitized substrate includes a second portion of substrate contacts configured to be coupled to a set of second die contacts disposed on the second die, such that the circuitized substrate electrically interconnects both the first and second portions of the set of substrate contacts and the set of input/output contacts to form a predetermined circuit.

The second die is attached directly to the first die without any gaps in between, other than the gap caused by the use of the adhesive. By placing the separate dies at the absolute closest proximity, trace lengths are minimized, and thermal issues as to Gm (transistor gain) differentials are substantially reduced. A standard device containing a pre-made die can be tested and made available. The second die, once attached to the pre-made die, can be wired and encapsulated to achieve a complete part which is custom designed to the target specification. This minimizes time to market and minimizes the need to fix complex custom microprocessors when bugs are found with either the original die or the custom die. Also, the resulting footprint of the smaller package saves board space and ensures greater reliability than separately packaged devices.

DETAILED DESCRIPTION OF THE INVENTION

The present invention provides for packaging multiple flipped dies on a ball grid array (BGA) substrate. For purposes of explanation, specific embodiments are set forth to provide a thorough understanding of the present invention. However, it will be understood by one skilled in the art, from reading this disclosure, that the invention may be practiced without these details. Further, although the present invention is described through the use of a ball grid array substrate, most, if not all, aspects of the invention apply to integrated circuit packages in general. Moreover, well-known elements, devices, process steps and the like are not set forth in detail in order to avoid obscuring the present invention.

Figure 1:
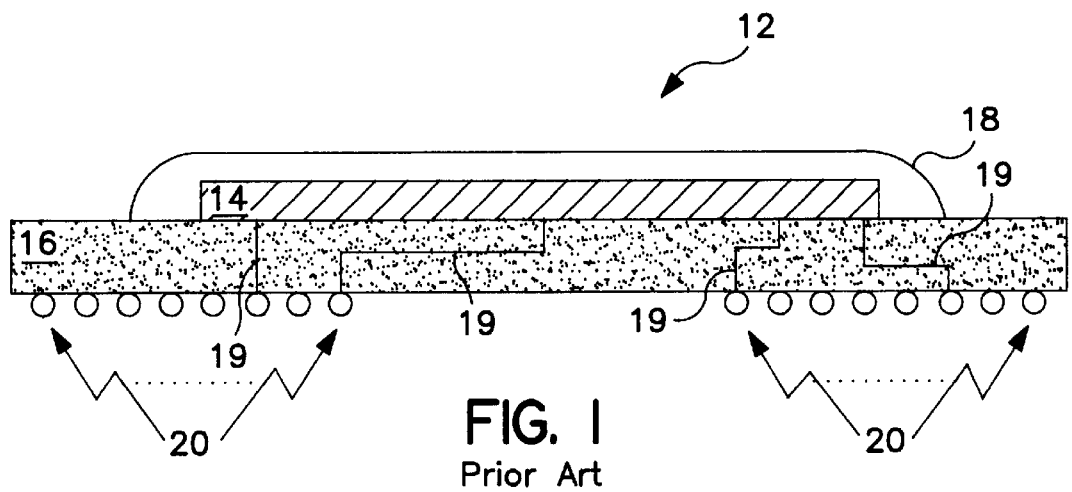
FIG. 1 illustrates a cut-away view of a prior art BGA package.
Figure 2:
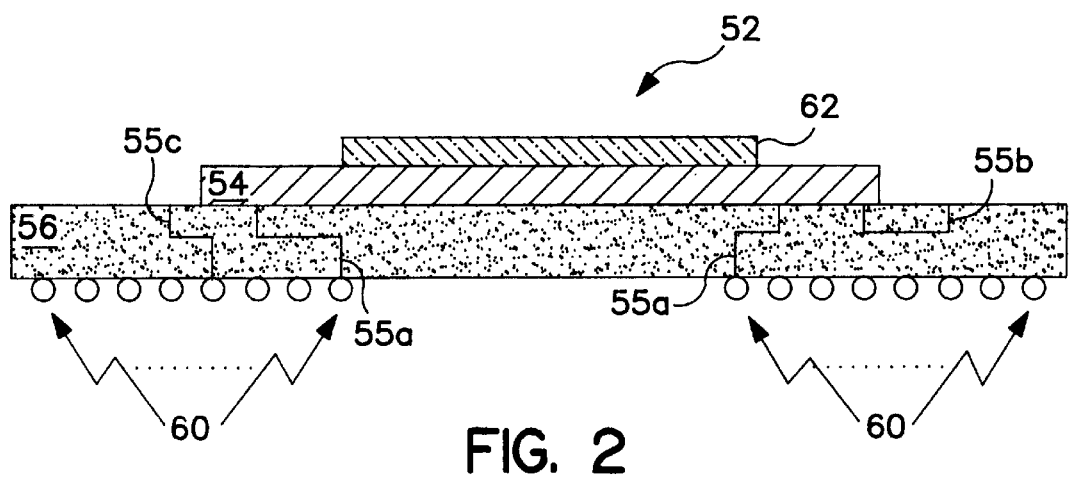
FIG. 2 illustrates a cut-away view of a BGA package being configured in accordance with a preferred embodiment of the present invention, containing a first die.

FIG. 2 illustrates a cut-away view of a BGA package 52 which is in the process of being configured in accordance with the present invention. BGA package 52 has a first die 54 mounted on a top surface of a substrate 56. First die 54 is mounted contact-side down using prior art techniques such as flip chip—or control collapse chip connection (C4)—technology to connect a set of input/output contact pads (not shown) of first die 54 to a first set of substrate contact pads (not shown) on substrate 56.

Substrate 56 contains a set of traces 55a, 55b, and 55c, also known as connection vias, of which a first portion of trace 55a is used to connect the first set of substrate contact pads on substrate 56 to a set of solder balls 60 on the bottom surface of substrate 56. The actual configuration of set of traces 55a, 55b, and 55c, and which ones of the set of input/output contact pads of first die 54 is connected to the set of substrate contact pads on substrate 56 are implementation details and therefore can be determined at the time the substrate is constructed.

In a preferred embodiment of the present invention, the structure as shown in FIG. 2 can be stored for later manufacturing or be outfitted with different integrated circuits as shown in FIGS. 3 through 6 to create custom packages.

Figure 3:
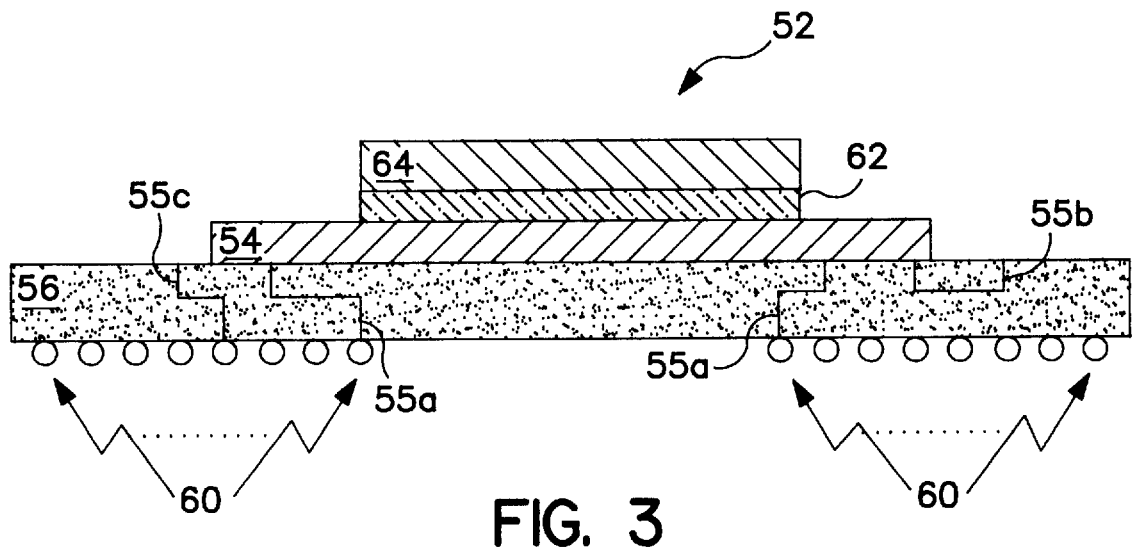
FIG. 3 illustrates a cut-away view of the BGA package in another stage of being configured in accordance with the preferred embodiment of the present invention, with a second die mounted on top of the first die.

FIG. 3 illustrates a cut-away view of a second die 64 mounted to first die 54 through the use of an adhesive layer 62. Second die 64 is attached to adhesive layer 62 after adhesive layer 62 has been applied to first die 54. As will be shown in FIG. 5, second die 64 is placed contact pad-side exposed. Thus, the "body" of second die 64 is what is in contact with adhesive layer 62.

In a preferred embodiment, adhesive layer 62 is both electrically and thermally conductive. The thermal conductivity property of adhesive layer 62 allows first die 54 and second die 64 to be thermally coupled, which allows first die 54 and second die 64 to operate at substantially the same temperatures. Moreover, the electrical conductivity property of adhesive layer 62 allows second die 64 to have the same ground potential as first die 54. Thus, if both first die 54 and second die 64 have negative-grounds, then the casing of first die 54 and second die 64 would be used as a common grounding point. Alternatively, the casing of first die 54 and second die 64 could be used as a positive ground.

In addition, it is to be noted that second die 64 cannot be of a shape or size that would leave any "overhang" over first die 54. That is, no part of second die 64 should be unsupported by first die 54, as it might lead to structural damage in second die 64 during the manufacturing process.

Figure 4:
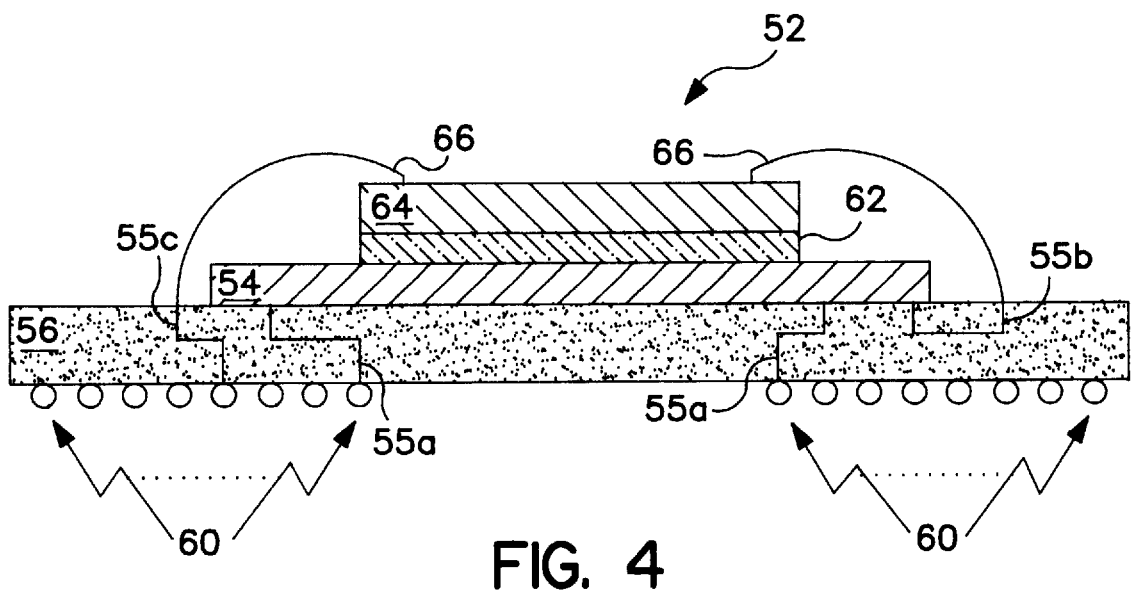
FIG. 4 illustrates a cut-away view of the BGA package in yet another stage of being configured in accordance with the preferred embodiment of the present invention, with a set of wire bonds having been installed on the second die.

FIG. 4 illustrates a cut-away view of a set of wire bonds 66 which electrically connect the input and output contact pads of second die 64 (see FIG. 6, below) to a second set of substrate contact pads on substrate 56 (also shown in FIG. 6, below). Set of wire bonds 66 are of the kind used in current wire bonding technologies and is well known to one skilled in the art.

As discussed above, first portion of traces 55a of set of traces 55a, 55b, and 55c contained in substrate 56 is used to electrically connect the first set of substrate contact pads to the input/output contact pads of first die 54. In the preferred embodiment, a second portion of trace 55b of set of traces 55a, 55b, and 55c in substrate 56 is also used to electrically connect the second set of substrate contact pads to the input/output contact pads of second die 64. A third portion of trace 55c of set of traces 55a, 55b, and 55c is used to connect the second set of substrate contact pads on substrate 56 with set of solder balls 60.

As will be discussed below in FIG. 6, set of traces 55a, 55b, and 55c in substrate 56 (as shown in FIG. 4) can be used to connect between one or more of the following contacts: (1) the first set of substrate contact pads (shown in FIG. 6); (2) the second set of substrate contact pads (also shown in FIG. 6); and (3) set of solder balls 60 (shown in FIGS. 2–5). In certain cases, it might be desirable to connect all three type of contacts together. This is to be determined during implementation.

Figure 5:
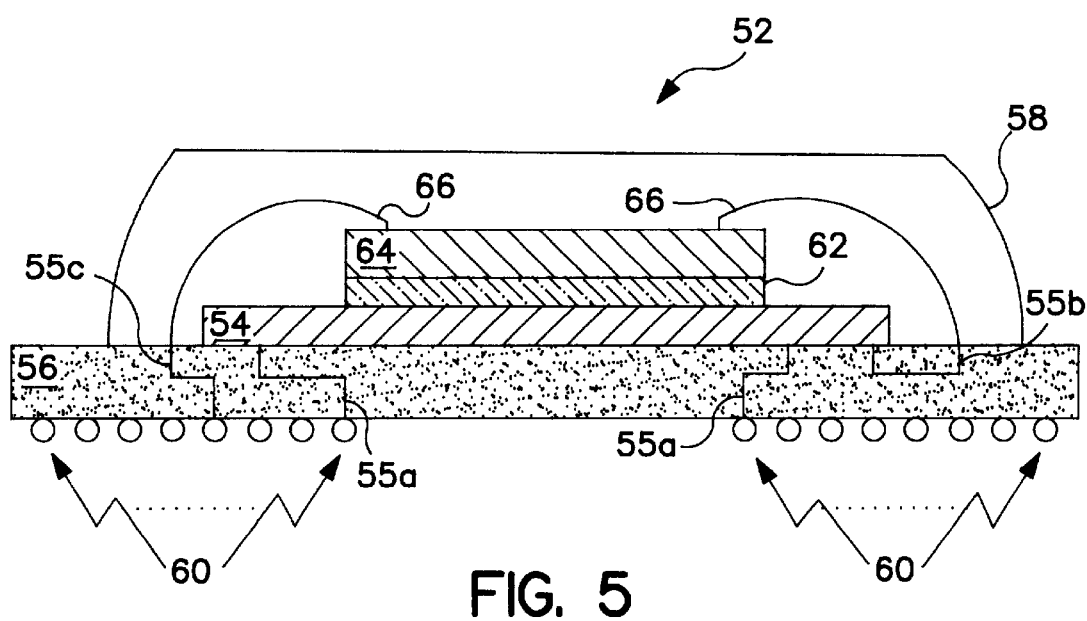
FIG. 5 illustrates a cut-away view of the BGA package after having been configured in accordance with the preferred embodiment of the present invention.

FIG. 5 illustrates a cut-away view of the encapsulation of first die 54, adhesive layer 62, second die 64, set of wire bond 66 and the second set of substrate contact pads inside an encapsulant 58 (the first set of substrate contact pads being covered under first die 54).

In the preferred embodiment, encapsulant 58 is of a thermally conductive material. The thermal conductivity property of encapsulant 58 allows first die 54 and second die 64 to be thermally coupled, which allows first die 54 and second die 64 to operate at substantially the same temperatures. Also, the thermal conductivity property allows heat sinks and other heat dissipation devices to be attached to encapsulant 58 to disperse the heat generated in operation of BGA package 52.

Figure 6:
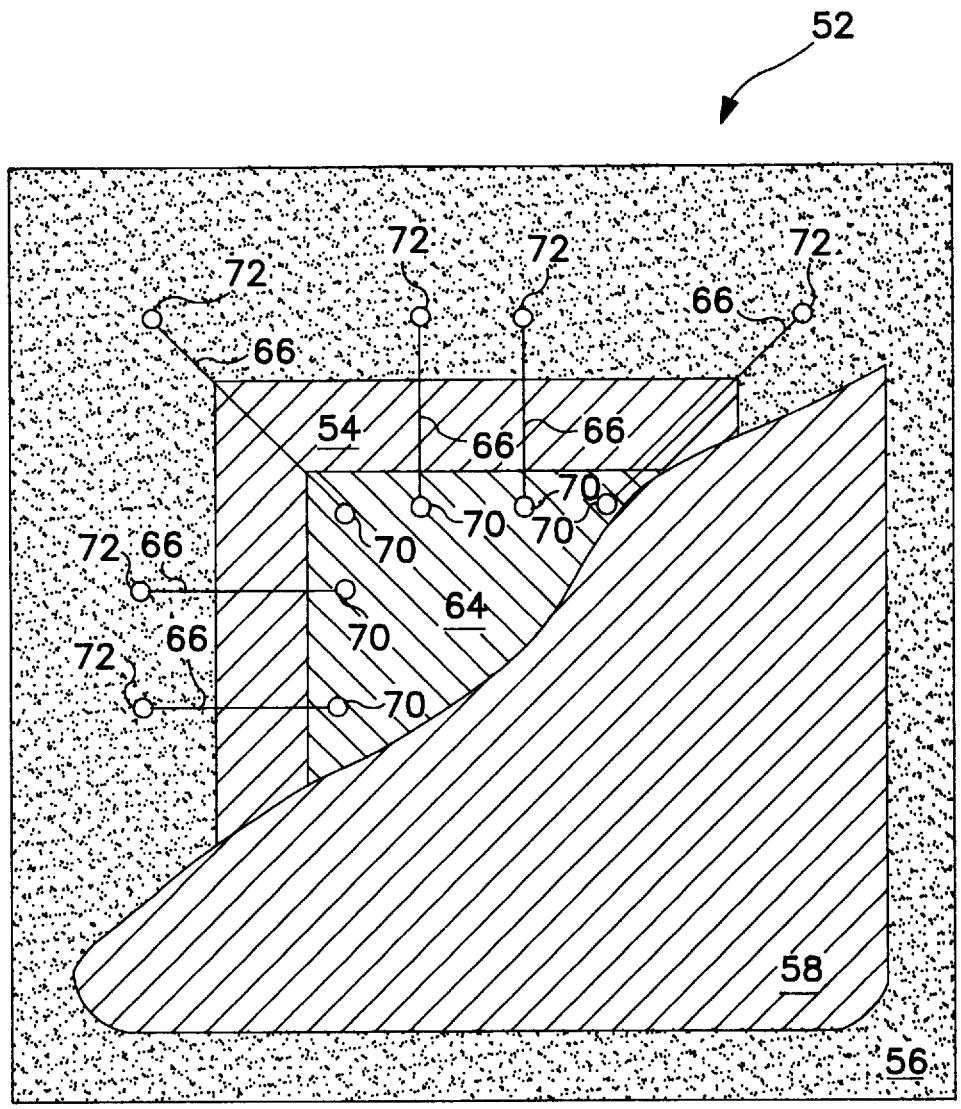
FIG. 6 illustrates a top-down view of the BGA package of FIG. 5.

FIG. 6 is a top-down view of BGA package 52 with a portion of encapsulant 58 cut-away to show the interconnections between a set of input/output contact pads 70 from second die 64 to a second set of substrate contact pads 72 through the use of set of wire bonds 66.

In the preferred embodiment, the inputs and outputs of first die 54 and second die 64 are connected to set of solder balls 60 (set of solder balls 60 being shown in FIGS. 2–5). In addition, the inputs and outputs of first die 54 and second die 64 can be connected to each other as desired, either through the use of traces in the circuit board to which BGA device 52 is mounted, or through the use of the traces (connection vias) in substrate 56.

In yet another embodiment, any necessary connections which need to be made between first die 54 and second die 64 would be made through the use of interconnections between set of solder balls 60, the interconnections being made on the circuit board to which BGA package 52 is mounted. Thus, a designer would only have to ensure that set of input/output contact pads 70 of second die 64 are wire bonded correctly to appropriate portions of second set of substrate contact pads 72.

Figure 7:
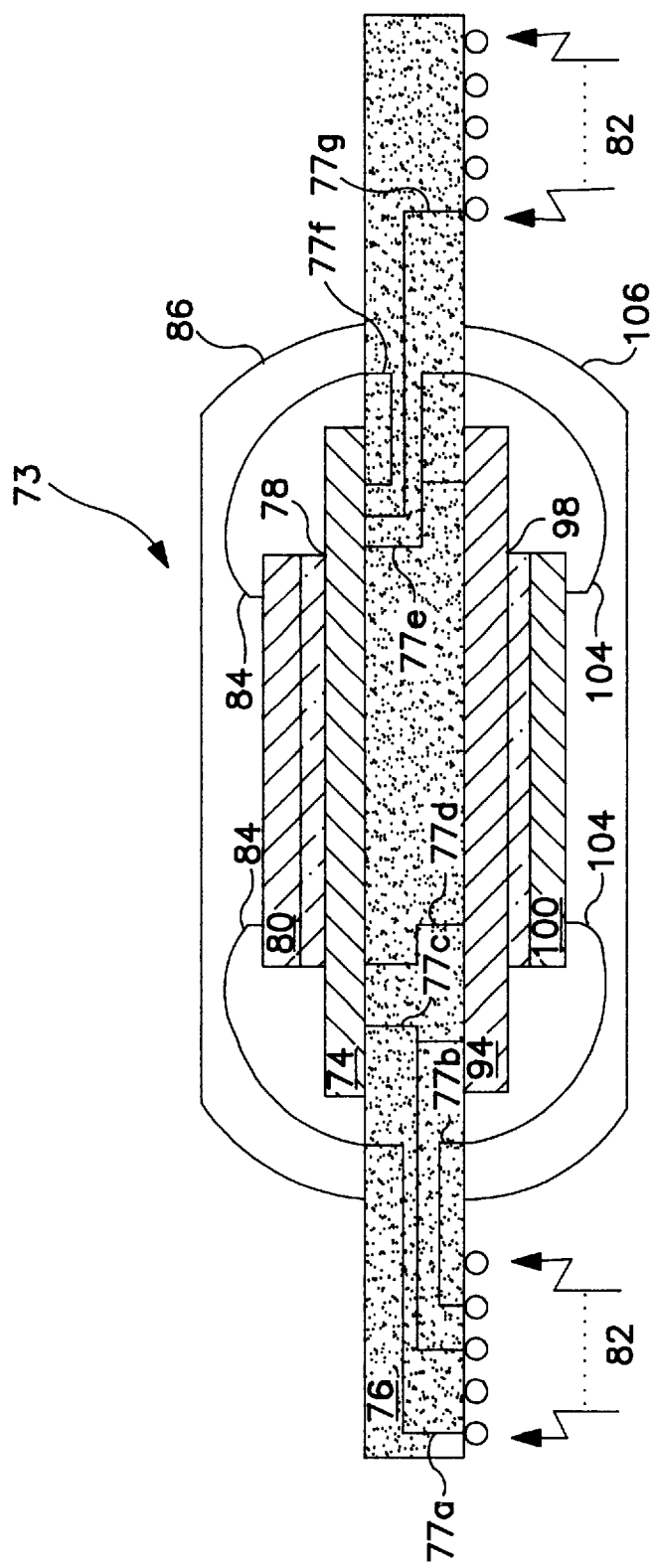
FIG. 7 illustrates a cut-away view of a second BGA package configured in accordance with another embodiment of the present invention.

FIG. 7 illustrates a cut-away view of a second BGA package 73 which is configured in accordance to a second embodiment of the present invention wherein a first top die 74 is mounted on a substrate 76; a second top die 80 is attached to first top die 74 through the use of a top adhesive layer 78; a top set of wire bonds 84 electrically connecting second top die 80 to a second portion of the set of contact pads located on top of substrate 76 (not shown); and top encapsulant 86 encapsulating first top die 74, top adhesive layer 78, second top die 80, and top set of wire bonds 84. FIG. 7 also illustrates a set of solder balls 82 which is mounted on substrate 76.

First top die 74 is in electrical connection with a first portion of set of solder balls 82 through the use of a first portion of traces 77c of a set traces 77a, 77b, 77c, 77d, 77e, 77f, and 77g (77a–77g) inside substrate 76 after the input and output contact pads of first top die 74 (not shown) is mounted to a first portion of the set of contact pads on top of substrate 76 (not shown) using, for example, flip-chip technology. The inputs and outputs of second top die 80 are also electrically connected to set of solder balls 82 through the use of top set of wire bonds 84; a second portion of the set of contact pads on top of substrate 76 and a second portion of traces 77a of set of traces 77a–77g. Thus, the inputs and outputs of second top die 80 are electrically connected to a second portion of set of solder balls 82.

Also illustrated in FIG. 7 is a first bottom die 94 mounted to the bottom of substrate 76; a second bottom die 100 attached to first bottom die 94 through the use of a bottom adhesive layer 98; a bottom set of wire bonds 104 coupling the inputs and outputs of second bottom die 100 (not shown) to a second portion of a set of contact pads located on the bottom of substrate 76 (not shown); and a bottom encapsulant 106 encapsulating first bottom die 94, bottom adhesive layer 98, second bottom die 100, and bottom set of wire bonds 104.

Similar to first top die 74, first bottom die 94 is electrically connected to set of solder balls 82 through the use of a third portion of traces 77c of set of traces 77a–77g in substrate 76 after the input and output contact pads of first bottom die 94 (not shown) is mounted to a first portion of the set of contact pads on the bottom of substrate 76 (not shown). Also, like second top die 80, second bottom die 100 is electrically connected to a third portion of set of solder balls 82 through the use of bottom set of wire bonds 104; the bottom set of contact pads on substrate 76 (not shown) and a fourth portion of traces 77b of set of traces 77a–77g.

Similar to BGA package 52, the inputs and output of first top die 74 and second top die 80 can be coupled to each other through the use of a fifth portion of traces 77f of set of traces 77a–77g in substrate 76 or, in the alternative, a set of traces contained in the circuit board to which second BGA package 73 is mounted. In addition, the inputs and outputs of first bottom die 94 and second bottom die 100 can be coupled using the same methods. Further, the inputs and outputs of all four devices: first top die 74; second top die 80; first bottom die 94; and second bottom die 100, can be coupled to each other using the same methods.

Alternatively, the four devices can have their inputs and outputs connected to each other and to any or all of set of solder balls 82 through the use of set of traces 77a–77g in substrate 76. This alternative configuration would not require additional traces on the circuit board to which second BGA package 73 is mounted. Also, as seen in FIG. 7, multiple inputs and outputs of all four of the devices can be connected by set of traces 77a–77g.

Figure 8:
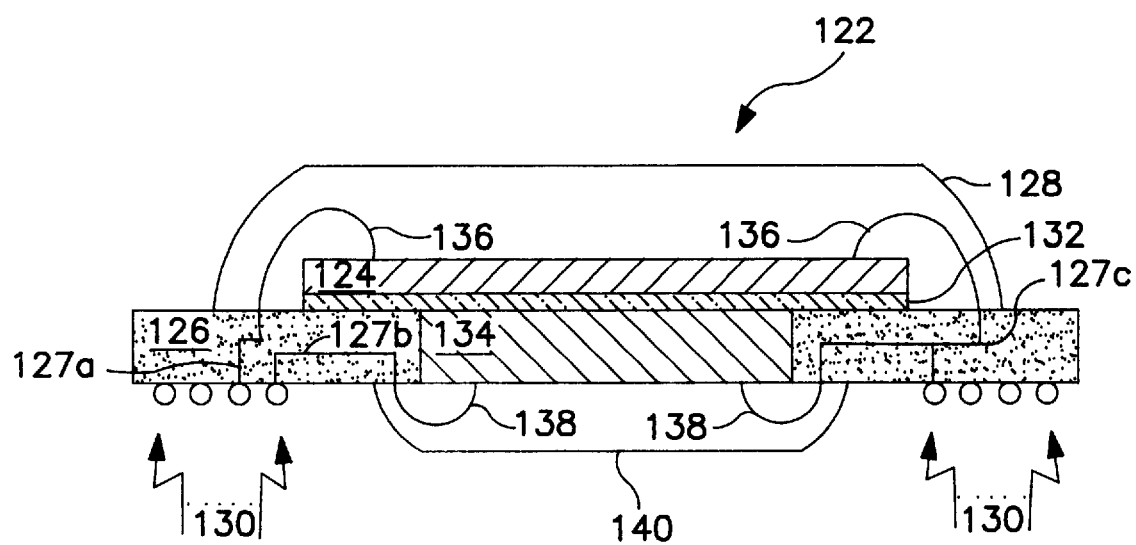
FIG. 8 illustrates a cut-away view of a third BGA package configured in accordance with yet another embodiment of the present invention.

FIG. 8 illustrates a cut-away view of a third BGA package 122 with a top die 124 mounted to substrate 126 through the use of an adhesive layer 132. The inputs and outputs of top die 124 are electrically coupled to a top set of contact pads on the surface of substrate 126 (not shown). The top set of contact pads are electrically coupled to a set of solder balls 130 located on the bottom side of substrate 126 through the use of a first portion of trace 127a of a set of traces 127a, 127b, and 127c (127a–127c) in substrate 126. Encapsulating top die 124, adhesive layer 132 and top set of wire bonds 136 is a top encapsulant 128.

Also shown in FIG. 8 is an embedded die 134 mounted underneath top die 124 through the use of adhesive layer 132. Embedded die 134 is located within substrate 126. The inputs and outputs of embedded die 134 are electrically connected to a set of bottom contact pads located on the bottom of substrate 126 (not shown) through the use of set of bottom wire bonds 138 similar to the set of top contact pads. The set of bottom contact pads are electrically connected to set of solder balls 130 through the use of a second portion of traces 127b of set of traces 127a–127c in substrate 126. A bottom encapsulant 140 covers set of bottom wire bonds 138 and the exposed surface of embedded die 134.

As discussed above, the inputs and outputs of top die 124; the inputs and outputs of embedded die 134; and set of solder balls 130 are interconnected through the use of set of traces 127a–127c in substrate 126. Thus, through the use of either: (1) a set of traces in substrate 126; or, (2) traces on the circuit board to which third BGA package 122 is mounted, the inputs and outputs of each of the devices and set of solder balls 130 can be connected in any configuration. The actual configuration of the set of traces in substrate 126 is an implementation detail to be specified by a designer according to the choice of specific devices and therefore is not further discussed herein.

Figure 9:
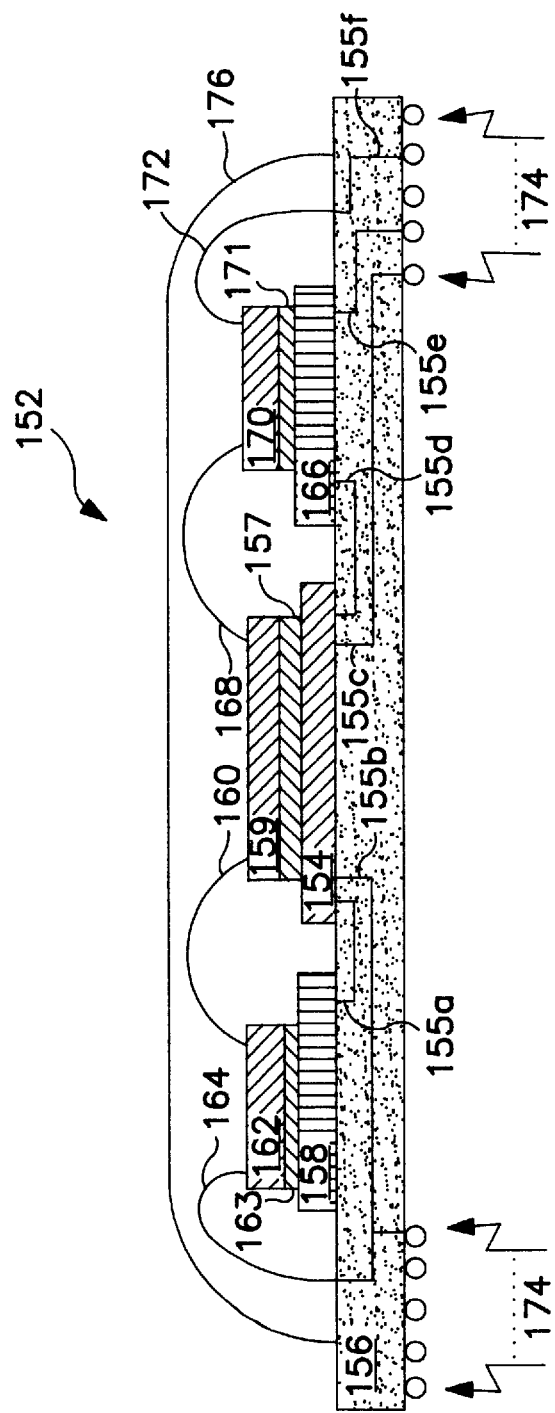
FIG. 9 illustrates a cut-away view of a fourth BGA package configured in accordance with still yet another embodiment of the present invention.

FIG. 9 illustrates a cut-away view of a fourth BGA package 152 configured in accordance with still yet another embodiment of the present invention. In FIG. 9, a first lower die 154, a second lower die 158, and a third lower die 166 are mounted to a substrate 156 using the die mounting techniques as mentioned above. Thus, each lower die has a set of input/output contact pads (not shown) that is connected to a portion of a set of substrate contact pads located on substrate 156 (not shown).

Attached to first lower die 154, second lower die 158, and third lower die 166 is a first upper die 159, a second upper die 162, and a third upper die 170 are attached to first lower die 154, second lower die 158, and third lower die 166, respectively, by using an first adhesive layer 157, an second adhesive layer 163, and a third adhesive layer 171, respectively. First upper die 159, second upper die 162, and third upper die 170 are attached contact pad-side exposed—i.e., the non-contact pad surface is the side that is attached to the adhesive layer.

A first set of die-to-die wire bonds 160 electrically connects a first portion of a set of input and outputs of first upper die 159 (not shown, see FIG. 10, below) to a first portion of a set of inputs and outputs of second upper die 162 (not shown, see FIG. 10, below). Similarly, a second set of die-to-die wire bonds 172 electrically connects a second portion of the set of input and outputs of first upper die 159 to a first portion of a set of inputs and outputs of third upper die 170 (not shown, see FIG. 10, below).

The first portion of the set of input and outputs of first upper die 159, the first portion of the set of inputs and outputs of second upper die 162, the second portion of the set of input and outputs of first upper die 159, and the first portion of the set of inputs and outputs of third upper die 170 can be connected in any configuration desired during the manufacturing process and therefore is only limited by wire bonding technology constraints. Thus, any input or output from each of the upper dies can be connected to any other input or output of the upper dies.

A first set of die-to-substrate wire bonds 164 connects a second portion of the set of inputs and outputs (not shown, see FIG. 10, below) of second upper die 162 to a portion of the set of substrate contact pads (not shown, see FIG. 10, below) on substrate 156. Second set of die-to-substrate wire bonds 172 similarly connects a second portion of the set of inputs and outputs (not shown, see FIG. 10, below) of third upper die 170 to another portion of the set of substrate contact pads (not shown) on substrate 156.

The set of substrate contact pads on substrate 156 is coupled to a set of solder balls 174 through the use of a set of traces 155a, 155b, 155c, 155d, 155e, and 155f (155a–155f). As seen in FIG. 9, the inputs and outputs of first upper die 159, second upper die 162, third upper die 170, first lower die 154, second lower die 158, and third lower die 166 can be interconnected with each other or with set of solder balls 174 in any fashion required in substrate 156.

Figure 10:
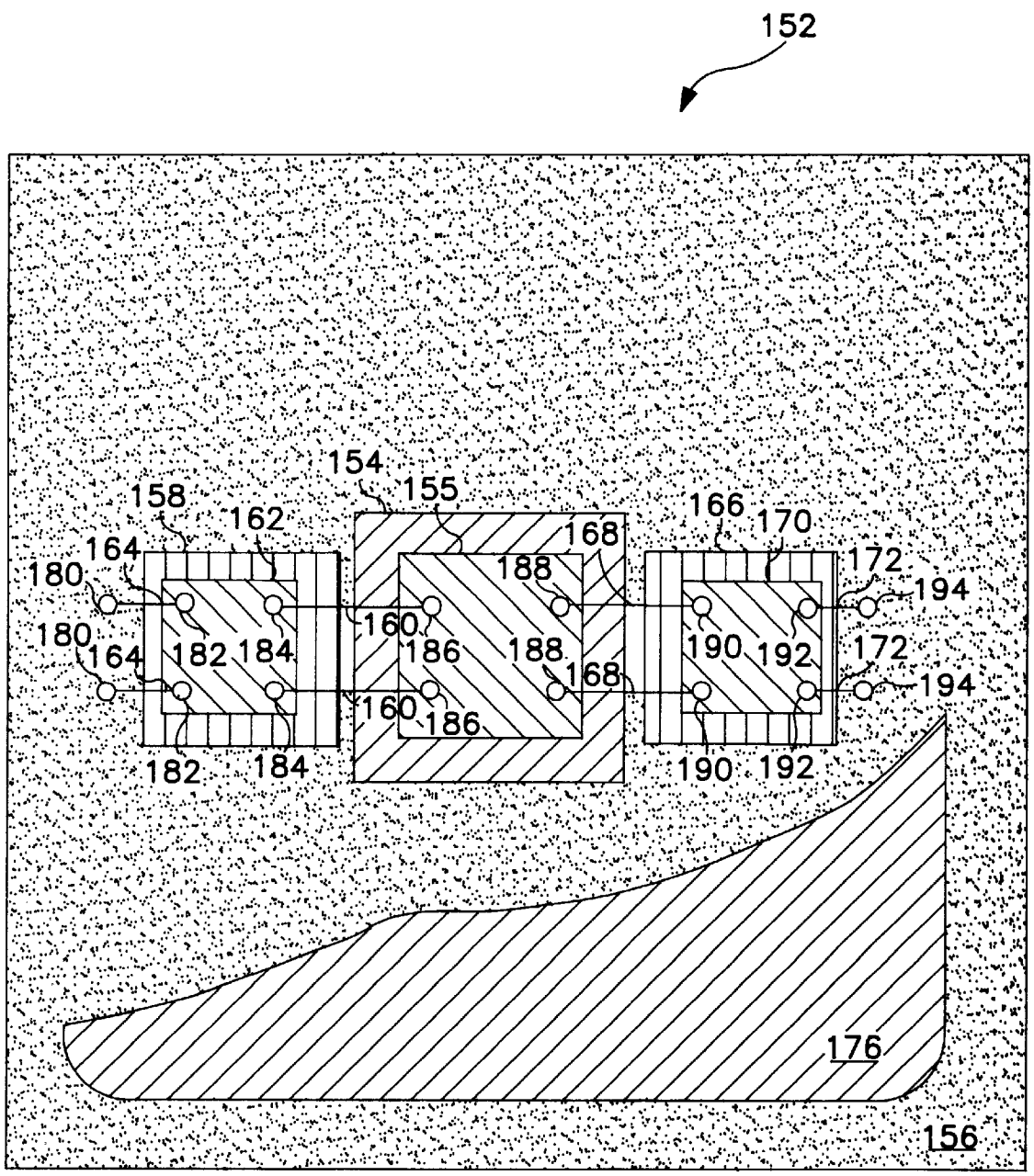
FIG. 10 illustrates a top-down view of the fourth BGA package of FIG. 9.

FIG. 10 illustrates a top-down view of fourth BGA package 152 with a portion of encapsulant 176 cut-away to show the interconnections between a first set of inputs/outputs 182 of second upper die 162 to a first set of substrate contact pads 180 through the use of first set of die-to-substrate wire bonds 164; a second set of inputs/outputs contact pads 184 of second upper die 162 is coupled to a first set of inputs/outputs contact pads 186 of first upper die 159 through the use of a first set of die-to-die wire bonds 160; a second set of inputs/outputs contact pads 188 coupled to a second set of inputs/outputs contact pads 190 through the use of second set of die-to-die wire bonds 168; and a second set of inputs/outputs contact pads of third upper die 170 to a second set of substrate contact pads 194 through the use of second set of die-to-substrate wire bonds 172.

In all the above embodiments, multiple connections to a contact pad or solder ball can be made to achieve distribution of common signals, such as clock signals or power and ground connections. The limitation imposed on any design would come from the type of substrate used and the number of layers contained in the substrate.

While the present invention has been particularly described with reference to the various figures, it should be understood that the figures are for illustration only and should not be taken as limiting the scope of the invention. Many changes and modifications may be made to the invention, by one having ordinary skill in the art, without departing from the spirit and scope of the invention.

What is claimed is:

1. An electrical arrangement comprising:
    a circuitized substrate having (i) a first substrate surface including a set of substrate contacts disposed thereon, and (ii) a second substrate surface including a set of input/output contacts disposed thereon; and,
    a first die having (i) a first die surface including a set of first die contacts disposed thereon which is coupled to a first portion of said set of substrate contacts, and (ii) a second die surface configured to receive a second die having a third die surface and a set of second die contacts disposed on said third die surface;
    wherein a second portion of said set of substrate contacts configured is to be coupled to said set of second die contacts disposed on said second die through the use of a set of electronically conductive wires, and said circuitized substrate electrically interconnects said first portion and second portion of said set of substrate contacts and said set of input/output contacts to form a predetermined circuit.

2. The electrical arrangement of claim 1, wherein said second die has a fourth die surface which is attached to said second die surface of said first die through the use of an adhesive material.

3. The electrical arrangement of claim 2, further comprising an encapsulant layer surrounding said first die, said second die, and said adhesive material, said set of electrically conductive wires and said set of substrate contacts.

4. An electrical arrangement comprising:
    a circuitized substrate having (i) a first substrate surface including a set of substrate contacts disposed thereon, and (ii) a second substrate surface including a set of input/output contacts disposed thereon;
    a first die having (i) a first die surface including a set of first die contacts disposed thereon which is coupled to a first portion of said set of substrate contacts, and (ii) a second die surface configured to receive a second die; and,
    a third die having a fifth die surface including a set of third die contacts disposed thereon which are in electrical connection with a third portion of said set of substrate contacts, said third die also having a sixth die surface;
    wherein a second portion of said set of substrate contacts configured is to be coupled to said set of second die contacts disposed on said second die through the use of a set of electronically conductive wires, and said circuitized substrate electrically interconnects said first portion and second portion of said set of substrate contacts and said set of input/output contacts to form a predetermined circuit.

5. The electrical arrangement of claim 4, further comprising:
    a fourth die having a seventh die surface including a set of fourth die contacts disposed thereon, said fourth die also having an eighth die surface.

6. The electrical arrangement of claim 5, further comprising:
    a second adhesive layer having a third adhesive surface adjacent to said sixth die surface of said third die and a second adhesive surface adjacent to said eighth die surface of said fourth die.

7. The electrical arrangement of claim 6, further comprising:
    a second set of electrically conductive wires connecting said set of fourth die contacts to a fourth portion of said set of substrate contacts.

8. The electrical arrangement of claim 7, wherein said circuitized substrate electrically interconnects said first portion, said second portion, said third portion, and said fourth portion of said set of substrate contacts and said set of input/output contacts to form a second predetermined circuit.

9. The electrical arrangement of claim 2, wherein said second die surface of said first die is of a first shape, said fourth die surface of said second die is of a second shape, and said second shape is contained within said first shape.

10. The electrical arrangement of claim 2, wherein said adhesive material is electrically conductive.

11. The electrical arrangement of claim 4, wherein said adhesive material is thermally conductive.

* * * * *